(12) United States Patent
Hsieh et al.

(10) Patent No.: US 9,741,638 B2
(45) Date of Patent: Aug. 22, 2017

(54) THERMAL STRUCTURE FOR INTEGRATED CIRCUIT PACKAGE

(71) Applicant: Taiwan Semiconductor Manufacturing Company, Ltd., Hsin-Chu (TW)

(72) Inventors: Cheng-Chieh Hsieh, Tainan (TW); Shin-Puu Jeng, Hsin-Chu (TW); Shang-Yun Hou, Jubei (TW); Way Lee Cheng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/149,834

(22) Filed: May 9, 2016

(65) Prior Publication Data
US 2016/0254211 A1 Sep. 1, 2016

Related U.S. Application Data

(62) Division of application No. 13/546,218, filed on Jul. 11, 2012, now Pat. No. 9,337,123.

(51) Int. Cl.
*H01L 23/427* (2006.01)
*H01L 23/367* (2006.01)
(Continued)

(52) U.S. Cl.
CPC .......... *H01L 23/427* (2013.01); *H01L 21/563* (2013.01); *H01L 23/3675* (2013.01);
(Continued)

(58) Field of Classification Search
CPC . H01L 23/427; H01L 23/3675; H01L 23/562; H01L 25/0657
See application file for complete search history.

(56) References Cited

U.S. PATENT DOCUMENTS 5,268,812 A * 12/1993 Conte ................. F28D 15/0233
165/104.33
5,856,911 A 1/1999 Riley
(Continued)

FOREIGN PATENT DOCUMENTS

JP 2007329163 A 12/2007

OTHER PUBLICATIONS

Blackshear, E. D. et al., "The Evolution of Build-up Package Technology and its Design Challenges," IBM Journal of Research and Development, POWER5 and Packaging, vol. 49, Nos. 4/5, Jul./Sep. 2005, pp. 341-661.
(Continued)

*Primary Examiner* — Kyoung Lee
*Assistant Examiner* — Christina Sylvia
(74) *Attorney, Agent, or Firm* — Slater Matsil, LLP

(57) ABSTRACT

One or more heat pipes are utilized along with a substrate in order to provide heat dissipation through the substrate for heat that can build up at an interface between the substrate and one or more semiconductor chips in a package. In an embodiment the heat pipe may be positioned on a side of the substrate opposite the semiconductor chip and through-substrate vias may be utilized to dissipate heat through the substrate. In an alternative embodiment, the heat pipe may be positioned on a same side of the substrate as the semiconductor chip and may be thermally connected to the one or more semiconductor chips.

20 Claims, 3 Drawing Sheets

(51) Int. Cl.
  *H01L 21/56* (2006.01)
  *H01L 25/065* (2006.01)
  *H01L 23/00* (2006.01)

(52) U.S. Cl.
  CPC ........ *H01L 23/3677* (2013.01); *H01L 23/562* (2013.01); *H01L 25/0657* (2013.01); *H01L 2224/16* (2013.01); *H01L 2224/32225* (2013.01); *H01L 2224/73204* (2013.01); *H01L 2224/73253* (2013.01); *H01L 2225/06517* (2013.01); *H01L 2225/06565* (2013.01); *H01L 2225/06589* (2013.01)

(56) References Cited

U.S. PATENT DOCUMENTS

| | | | |
|---|---|---|---|
| 5,947,193 | A | 9/1999 | Adkins et al. |
| 5,990,418 | A * | 11/1999 | Bivona ................... H01L 23/16 174/546 |
| 5,990,550 | A | 11/1999 | Umezawa |
| 6,452,799 | B1 | 9/2002 | Azar |
| 6,716,676 | B2 | 4/2004 | Chen et al. |
| 8,106,497 | B2 | 1/2012 | Brunnbauer et al. |
| 2002/0061665 | A1 | 5/2002 | Batinovich |
| 2003/0020151 | A1* | 1/2003 | Chen ................... H01L 23/3128 257/678 |
| 2003/0030968 | A1 | 2/2003 | Tsao et al. |
| 2003/0035269 | A1* | 2/2003 | Chiu ................... H01L 23/367 361/704 |
| 2004/0150116 | A1 | 8/2004 | Wang |
| 2004/0196634 | A1 | 10/2004 | Mallik et al. |
| 2005/0067680 | A1 | 3/2005 | Boon et al. |
| 2005/0110128 | A1 | 5/2005 | Ahn et al. |
| 2007/0187069 | A1 | 8/2007 | Ueno et al. |
| 2008/0001283 | A1 | 1/2008 | Lee et al. |
| 2008/0067673 | A1 | 3/2008 | Takamatsu et al. |
| 2010/0148356 | A1* | 6/2010 | Tamaki ................ H01L 23/427 257/712 |
| 2011/0316147 | A1 | 12/2011 | Shih et al. |
| 2012/0001927 | A1 | 1/2012 | Tiggs et al. |
| 2012/0020028 | A1 | 1/2012 | Bachman et al. |
| 2012/0049347 | A1 | 3/2012 | Wang |
| 2012/0087090 | A1 | 4/2012 | Feng et al. |
| 2012/0098123 | A1 | 4/2012 | Yu et al. |
| 2013/0009175 | A1 | 1/2013 | Hsu et al. |
| 2013/0020028 | A1 | 1/2013 | Nakano |
| 2013/0093073 | A1 | 4/2013 | Chen et al. |
| 2014/0015106 | A1 | 1/2014 | Hsieh et al. |
| 2014/0097532 | A1 | 4/2014 | Chiang et al. |

OTHER PUBLICATIONS

Linder, S. et al., "Fabrication Technology for Wafer Through-Hole Interconnections and Three-Dimensional Stacks of Chips and Wafers," IEEE International Conference on Micro Electro Mechanical Systems, MEMS 94, Jan. 1994, Oiso, Japan, pp. 349-354.

Ritchey, Lee W., "Anatomy of a Plated Through Hole," Speeding Edge, Aug. 30, 2001, 5 pages.

* cited by examiner

THERMAL STRUCTURE FOR INTEGRATED CIRCUIT PACKAGE

This application is a divisional application of and claims the benefit of U.S. patent application Ser. No. 13/546,218, filed Jul. 11, 2012 and entitled "Thermal Structure for Integrated Circuit Package," which application is hereby incorporated herein by reference.

BACKGROUND

The continuous growth of the semiconductor industry is due in no small part to the constant improvements in the integration density of electronic components (i.e., transistors, diodes, resistors, capacitors, etc.) by reducing their physical sizes to allow for a greater number of components to be placed in a given chip area. Some improvements are two-dimensional (2D) in nature in that the devices are fabricated on the surface of a semiconductor wafer. And even though advancements in lithography have enabled each new technology generation to feature smaller sizes than the previous one, there is an eventual physical limitation to the minimum size needed to make these components function properly. Additionally, when more devices are placed in one chip, the design complexity also increases.

One solution to solving the problems discussed above is to stack dies on top of one another and interconnect or route them through connections such as through-silicon vias (TSVs). Such a configuration is named a three-dimensional integrated circuit (3DIC). Some of the benefits of 3DIC, for example, include exhibiting a smaller footprint, reducing power consumption by reducing the lengths of signal interconnects, and improving yield and fabrication cost if individual dies are tested separately prior to assembly.

A typical problem with three-dimensional integrated circuit is heat dissipation during operation. Currently, most heat dissipation is performed by front side cooling with natural convection or by attaching a heat sink to the top of a package. In a 3DIC, for example, when a top die is stacked to a bottom die, a heat sink may be mounted on the top die. As a result, the top die may experience good heat-dissipating condition through natural convection with ambient air flow or with forced convection by utilizing a fan. However, the heat generated in the bottom die must travel through the potentially high thermal resistance of the top die in order to reach the heat sink. Hence, the bottom die may suffer from a heat-dissipation problem as the junction temperature will rise very quickly and exceed specifications. A prolonged exposure of a die by operating at excessive temperatures may decrease the reliability and operating lifetime of the die. This problem may become severe if the bottom die is a computing die such as a central processing unit (CPU), which generates a lot of heat.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the disclosure.

A package structure with heat pipes is provided in accordance with various embodiments in order to improve thermal performance by inducing substrate-side cooling in the package and provide additional heat dissipation through the substrate side of the package. The variations of the embodiments are discussed. Throughout the various views and illustrations, like reference numbers are used to designate like elements.

Figure 1A:
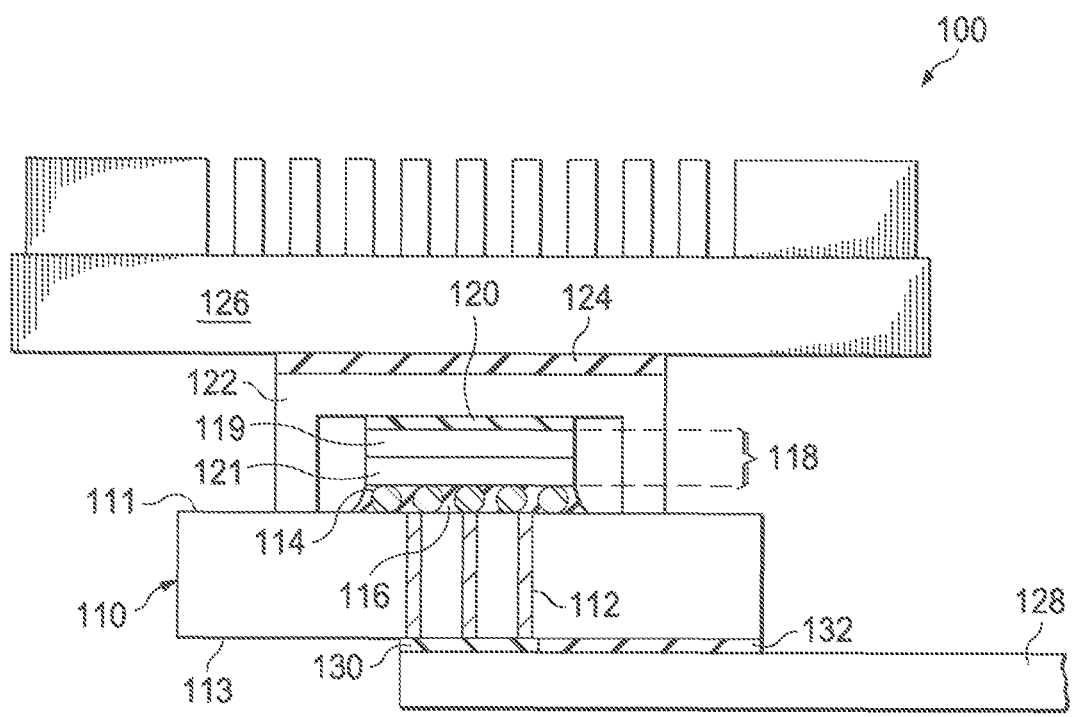
FIGS. 1A and 1B are a cross-sectional view and a top view, respectively, of package components with a heat pipe on a bottom of a substrate in accordance with an embodiment.

FIG. 1A depicts a cross-sectional view of a package 100 with a substrate 110 and a plurality of dies 118. The substrate 110 may provide a structural base and an electrical interface from the plurality of dies 118 to other devices and systems (not individually illustrated in FIG. 1A). For example, the substrate 110 may comprise multiple conductive layers (not individually illustrated), some of which are inter-layers within the substrate 110. These layers may be etched into traces of various widths and lengths and connected through inter-layer vias. Together, the lines and vias may form an electrical network to route DC power, ground, and signals from one side of the substrate 110 to the other. Those of skill in the art will recognize the substrate 110 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize the conductive layers and vias may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like.

In some embodiments, the substrate 110 may include electrical elements, such as resistors, capacitors, signal distribution circuitry, combinations of these, or the like. These electrical elements may be active, passive, or a combination thereof. In other embodiments, the substrate 110 is free from both active and passive electrical elements therein. All such combinations are fully intended to be included within the scope of the embodiments.

Through-substrate vias 112, which may also be called thermal vias, may be formed in the substrate 110 from a top surface 111 of the substrate 110 to a bottom surface 113 of the substrate 110 in order to provide a path for thermal conduction from the bottom die 121. The through-substrate vias 112 may be formed by any suitable technique and of any suitable material(s) of high thermal conductivity, such as copper, aluminum, other metals, alloys, combinations thereof, or the like. For example, the through-substrate vias 112 may be formed by utilizing a laser to drill a hole completely through the substrate 110 and depositing a thermally conductive material therein. In another example, the through-substrate vias 112 may be formed by etching a hole partially through the substrate 110 and depositing a thermally conductive material therein, after which the backside of the substrate 110 may be thinned to expose the through-substrate vias 112 on the backside of substrate 110.

Additionally, while three through-substrate vias 112 are illustrated in FIG. 1A, this number of through-substrate vias 112 is only for illustrative purpose. Any suitable number of through-substrate vias 112 greater than one may be utilized as desired for the proper transfer of heat for the geometric configuration of the particular package and the dimension of the through-substrate vias 112. Any such number of through-substrate vias 112 placed in any suitable pattern may also be utilized and all such numbers and combinations are fully intended to be included within the scope of the embodiments.

In an embodiment, the package 100 may be used for a 3DIC structure in which a plurality of dies 118 is stacked on top of one another on the substrate 110. For example, a top die 119 may be stacked above a bottom die 121. The top die 119 and the bottom die 121 may be formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the top die 119 and the bottom die 121 to construct functional circuitries. In addition, alternating layers of conductive materials (such as copper, aluminum, alloys, doped polysilicon, combinations thereof, or the like) may be utilized between layers of dielectric material to form interconnections between the active and passive devices and also to provide an external connections between the active and passive devices and other external devices.

Additionally, the plurality of dies 118 shown in FIG. 1A is merely for illustrative purpose. While two dies (the bottom die 121 and the top die 119) are illustrated, alternative embodiments may have a number of dies greater or smaller than the number illustrated (including a single die) in order to meet desired functionalities and/or specifications. For example, a wireless sensor die may be stacked upon a digital signal processing die, which may be stacked on top of a power management unit die to deliver a complete remote sensory system. Another embodiment may include a multiple of memory dies spaced horizontally, but stacked vertically on top of a multi-core processing die for desired bandwidth and power consumption specifications. Any suitable combination of dies may be utilized, and all such combinations are fully intended to be included within the scope of the embodiments.

The bottom die 121 may be connected to a top surface 111 of the substrate 110, e.g., through flip-chip bonding by way of solder balls 114. Solder balls 114 provide electrical and thermal connections between the plurality of dies 118 and the substrate 110. However, alternative methods of electrically and physically attaching the bottom die 121 to the substrate 110, such as C4 bumps, micro-bumps, pillars, columns, or other structures formed from a conductive material such as solder, metal, or metal alloy, may be utilized to facilitate electrical, physical, and thermal connectivity between the bottom die 121 and the substrate 110.

Additionally, the number and configuration of solder balls 114 illustrated in FIG. 1A, five evenly spaced connections, is only for illustrative purpose. Any plurality of solder balls 114 in any configuration may be employed to realize the desired electrical and thermal conductivities. In other embodiments, other alternative methods of joining the plurality of dies 118 to substrate 110, such as wire-bonding or tape-automated bonding (TAB), may be used.

A material of underfill 116, such as silica filled epoxy resin, may be used to fill the gap space in between the solder balls 114 and in between the plurality of dies 118 and the substrate 110. The underfill 116 increases mechanical reliability by distributing stresses across the top surface 111 of substrate 110 rather than allowing them to become concentrated in the solder balls 114. In addition, the underfill 116 provides encapsulation from moisture and contaminants in the external environment.

The top die 119 may be attached to a frame of metal lids 122 or a heat spreader through the employment of a first thermal paste 120, for example. The first thermal paste 120 may be a viscous, silicone compound similar to the mechanical properties of a grease or a gel. The first thermal paste 120 is used to improve electrical and/or thermal conduction by filling in microscopic air pockets created between minutely uneven surfaces, such as the region between surfaces of the top die 119 and the metal lids 122.

In some embodiments, the plurality of dies 118 may be electrically and thermally connected to the metal lids 122 and eventually to a heat sink 126. For such an example, a metal-based thermal paste containing silver, nickel, or aluminum particles suspended in the silicone grease may be used. In alternative embodiments where the plurality of dies 118 may only require thermal conduction to the heat sink 126 excluding metal lids 122, non-electrically conductive, ceramic-based pastes, filled with ceramic powders such as beryllium oxide, aluminum nitride, aluminum oxide, or zinc oxide, may be applied. Moreover, some embodiments may not require a first thermal paste 120 and the heat sink 126 may be in direct contact with the plurality of dies 118.

In some embodiments, metal lids 122 may be deployed to supply electrical and/or thermal pathways for the plurality of dies 118 to spread the heat generated from the plurality of dies 118 over a larger area, especially for high power applications. In an embodiment the metal lids 122 may comprise copper, aluminum, other metals, alloys, combinations thereof, or other material of high electrical and thermal conductivities. In additional, the metal lids 122 may attach from the top die 119 to the top surface 111 of the substrate 110 to establish electrical connections to the substrate 110.

In this embodiment, the metal lids 122 may be attached to the heat sink 126 through the use of a second thermal paste 124. In an embodiment the second thermal paste 124 may be similar to the first thermal paste 120 such as a viscous, silicone compound. In other embodiments, the second thermal paste 124 may be replaced by thermal tape or thermal epoxy. Furthermore, in some embodiments, mechanical fixtures using clips, pins, and springs (not shown) may be used, where the heat sink 126 is in direct contact with the metal lids 122.

The heat sink 126 may be mounted over and thermally coupled to the metal lids 122 and the plurality of dies 118. The heat sink 126 may be formed using materials exhibiting high thermal conductivity such as aluminum, copper, diamond, other metals, alloys, combinations thereof, and the like. The heat sink 126 aids in the cooling of the plurality of dies 118 by increasing a given surface area to be exposed to a cooling agent surrounding it such as air. The heat transfer mechanisms occur through the convection of the surrounding air, the conduction through the air, and radiation. For example, the heat sink 126 may exhibit a much greater surface area for convection compared with the surface area of the plurality of dies 118 by employing a large number of fins in the form of a matrix of geometrically shaped pins or an array of straight or flared fins. In another example, such as where convection is low, a matted-black surface color may radiate much more efficiently than shiny, metallic colors in the visible spectrum. Any suitable form for the heat sink 126 may alternatively be utilized.

On the bottom surface 113 of the substrate 110, a first heat pipe 128 may be attached to the substrate 110 in thermal connectivity with the through-substrate vias 112 with a thermal interface material (TIM) 130. The TIM 130 makes contact with the through-substrate vias 112 on the bottom surface 113 of the substrate 110 to provide a thermally conductive connection between the first heat pipe 128 and the through-substrate vias 112. This TIM 130 may be a third thermal paste and may be similar to the first thermal paste 120 and/or the second thermal paste 124, but is not limited to such. For example, the TIM 130 may be a silicone rubber with thermally-conductive fillers such as aluminum oxide and/or boron nitride.

The first heat pipe 128 may be a structure which transfers or removes heat from a heat generator such as the bottom die 121 by using a closed, two-phase change cycle and/or thermal conduction. Thermal energy at a heat source connected to the first heat pipe 128 evaporates a liquid or fluid inside the first heat pipe 128. The pressure gradient generated by the vaporization process generates movement of the vapor to a cooler part of the first heat pipe 128 where the vapor condenses into a liquid again as the heat is released into, e.g., a second heat sink and/or a fan. The second heat sink and/or fan may be connected to dissipate the heat into the ambient environment. At the same time, the condensed liquid is forced back to the evaporation part of first heat pipe 128 through capillary action and the cycle reiterates.

The first heat pipe 128 may consist of, e.g., three components. The first component may consist of a hollow vessel or a tube made of copper, nickel, aluminum, other metals, alloys, combinations thereof, or other materials with high thermal conductivity. The second part may comprise a wick structure within the vessel and may be constructed with, e.g., woven fiberglass, sintered metal powder, wire mesh, composite materials of different porosities, combinations of these, and the like, to transport a liquid medium. The third element may involve a working fluid such as water, methanol, Flutec PP2, combinations of these, and the like, which may operate on a cycle of evaporation and condensation within the vessel at a desired temperature range without causing corrosion or chemical reaction to the tube.

The cross-section of the first heat pipe 128 can adopt a variety of geometries depending on application requirements. For example, the first heat pipe 128 may have a circular, cross-sectional diameter from about 1.5 mm to over about 30 mm, such as between about 2 mm and about 3 mm, although any suitable diameter may be utilized based upon the specific design. In another embodiment where the cooling of an array of semiconductor devices may require a flat surface, a rectangular shaped cross-section may be implemented. Additionally, the first heat pipe 128 may have a length sufficient to remove the heat away from the through-substrate vias 112 to be dissipated. As such, while the length of the first heat pipe 128 may be at least in part dependent upon the dimensional requirements of the package 100 within the overall electronic system, in an embodiment the first heat pipe 128 may have a length of between about 100 mm and about 350 mm, such as about 150 mm, although the precise dimensions will be based, at least in part, on the dimensions of the package.

Additionally, while a single first heat pipe 128 is illustrated as being employed on the bottom surface 113 of the substrate 110, this number is only for illustrative purpose. A plurality of heat pipes 128 (not shown) may be placed to meet thermal and packaging desires. In addition, the first heat pipe 128 may be configured in any suitable geometry to provide for any desired thermal connection with consideration to the number of through-substrate vias 112. All such combinations of numbers and geometries are fully intended to be included within the scope of the embodiments.

A sealant 132 may be applied between the first heat pipe 128 and the substrate 110 in order to provide some mechanical stability and protection. The sealant 132 may be a silicone compound that demonstrates properties such as good adhesion, good electrical insulation, thermal stability, low thermal conductivity, low chemical reactivity, and an ability to repel water. However, any suitable material may alternatively be utilized for the sealant 132.

By providing the through-substrate vias 112 and the first heat pipe 128, additional heat dissipation is provided to the plurality of dies 118 through the substrate 110. As such, the addition of the heat transfer through the substrate 110 enhances the overall heat transfer that is available to remove heat from the plurality of dies 118. As such, problems with heat building up within multiple chip stacks may be reduced or eliminated.

Figure 2A:
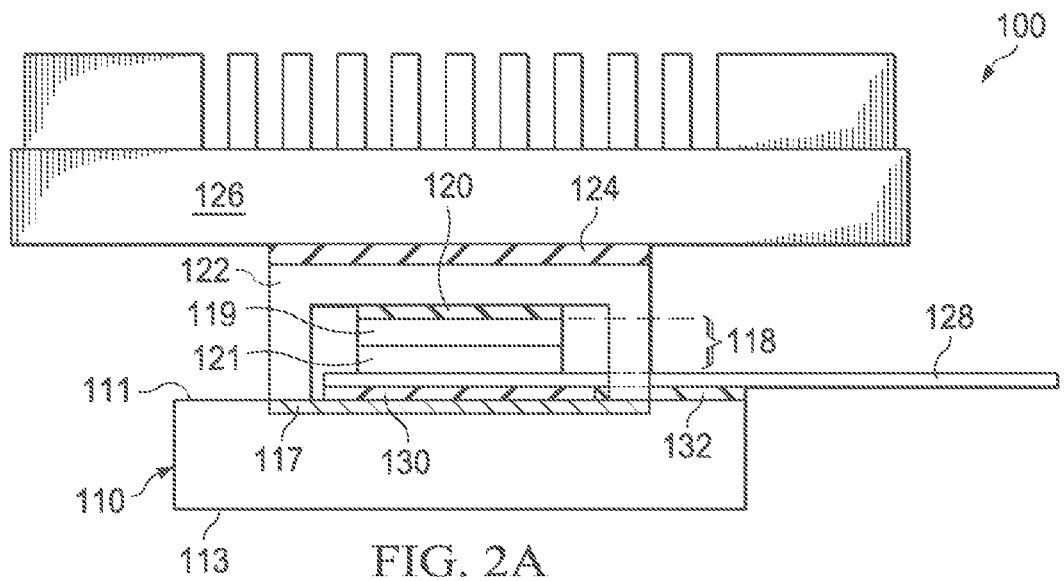
FIGS. 2A and 2B are a cross-sectional view and a top view, respectively, of package components with a heat pipe on a top of the substrate around stacked dies in accordance with an embodiment.

FIG. 2A illustrates another embodiment of the package 100. In this embodiment, the first heat pipe 128, instead of being attached to the bottom surface 113 of the substrate 110, is instead attached to the top surface 111 of the substrate 110 in order to remove heat directly from the interface between the bottom die 121 and the substrate 110. Such a configuration also allows for the option of not forming the through-substrate vias 112 in the substrate 110, making the manufacturing of the substrate 110 easier and more efficient.

In order to facilitate thermal transfer from the interface between the bottom die 121 and the substrate 110 to the first heat pipe 128, a portion of the top layer of the substrate 110 may be replaced by a layer of thermally conductive material 117. By placing the thermally conductive material 117 extending between the first heat pipe 128 and the interface of the bottom die 121 and the substrate 110, the thermally conductive material 117 may provide for a thermal path for the removal of heat.

The thermally conductive material 117 may be formed of any suitable material of high thermal conductance, such as copper, aluminum, silver, gold, alloys, combinations thereof, and/or the like. To form the thermally conductive material 117, a portion of a top layer of the substrate 110 may be removed using, e.g., a suitable photolithographic masking and etching process. In an embodiment between about 2.5 cm and about 4 cm, such as about 3.5 cm, of the substrate 110 may be removed. Once a portion of the substrate 110 has been removed, the thermally conductive material 117 may then be formed into the opening by any suitable technique, such as electro-chemical plating, electroless plating, and other deposition methods such as sputtering, printing, chemical vapor deposition, or the like. Alternatively, the thermally conductive material 117 may be formed directly on the substrate 110.

Additionally, while the thermally conductive material 117 may be formed by itself in separate processs, the thermally conductive material 117 may also be formed at the same time as other conductive traces (not individually illustrated in FIG. 2A) formed on the substrate 110. For example, in an embodiment in which copper traces are formed on the surface of the substrate 110, the thermally conductive material 117 may be formed at the same time using the same processes and materials as the copper traces. By utilizing the same processes, no additional photolithorgraphic masking and etching would be required, thereby making the overall process more efficient.

Figure 2B:
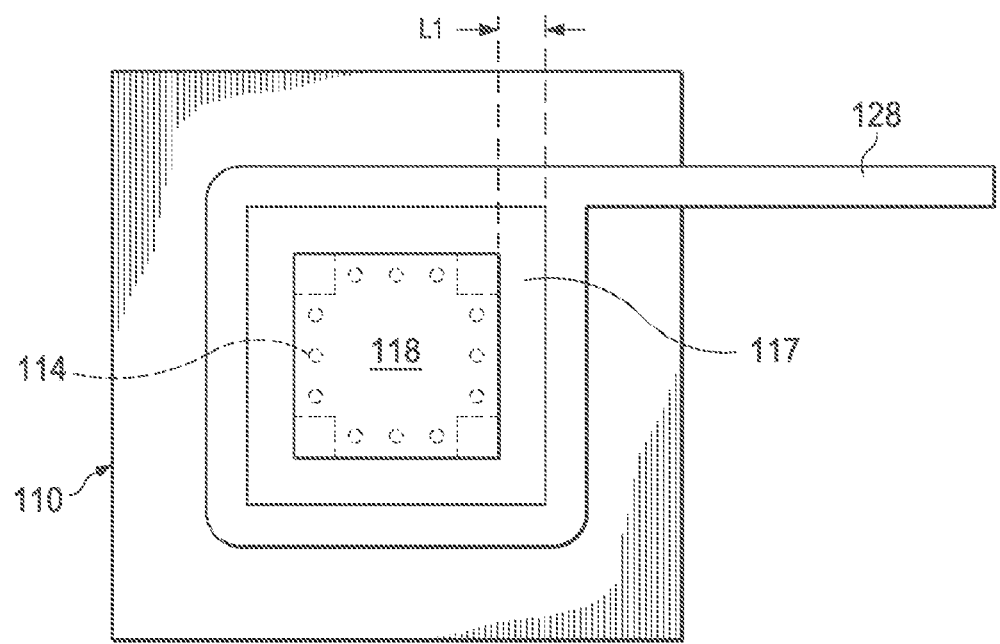

The thermally conductive material 111 may be positioned around the plurality of dies 118 where hot spot regions may be located, such as the position illustrated in FIG. 2B. Thermal conductance is made from the plurality of dies 118 to the thermally conductive material 111. In some embodiments, the thermally conductive material 111 may be extended to contact one or more solder balls 114 (such as dummy solder balls that do not carry power, ground, or signals) beneath the plurality of dies 118 to increase thermal pathways for the bottom die 121 to the first heat pipe 128. In accordance to other embodiments, other thermal connections may be made through thermally conductive pillars or columns (not shown) beneath the bottom die 121.

The first heat pipe 128 may be connected to the surface of the thermally conductive material 111 using a second thermal interface material (TIM) 130. The second TIM 130 may be similar to the first thermal paste 120 and/or the second thermal pastes 124, but is not restricted to such. In some embodiments, the methods used to join the parts may include the use of thermally conductive adhesives, thermally conductive silicone rubber, as well as brazed or soldered techniques, or the like.

In an embodiment, the first heat pipe 128 may be bent into a square ring configuration to encircle the plurality of dies 118. For example, the first heat pipe 128 may be a square ring and positioned at a distance L1 of between about 0.5 cm and about 3 cm, such as about 3 cm away from the plurality of dies 118. Such a configuration may increase the surface area of the first heat pipe 128 in contact with thermally conductive material 111 to more efficiently spread heat away from the bottom die 121 in all directions.

In alternative embodiments, sections of the first heat pipe 128 adjacent to the plurality of dies 118 may be configured in a circular, pattern, or a meandering pattern (not individually shown) to enlarge the contacting surface area for additional heat transfer. And although FIG. 2A shows a single heat pipe 128 carrying thermal energy away from the ring configuration, more than one heat pipe 128 may be used depending on the desired thermal and size characteristics. Any suitable shape and size may be utilized for the first heat pipe 128 in order to remove heat from the interface between the bottom die 121 and the substrate 110.

Figure 1B:
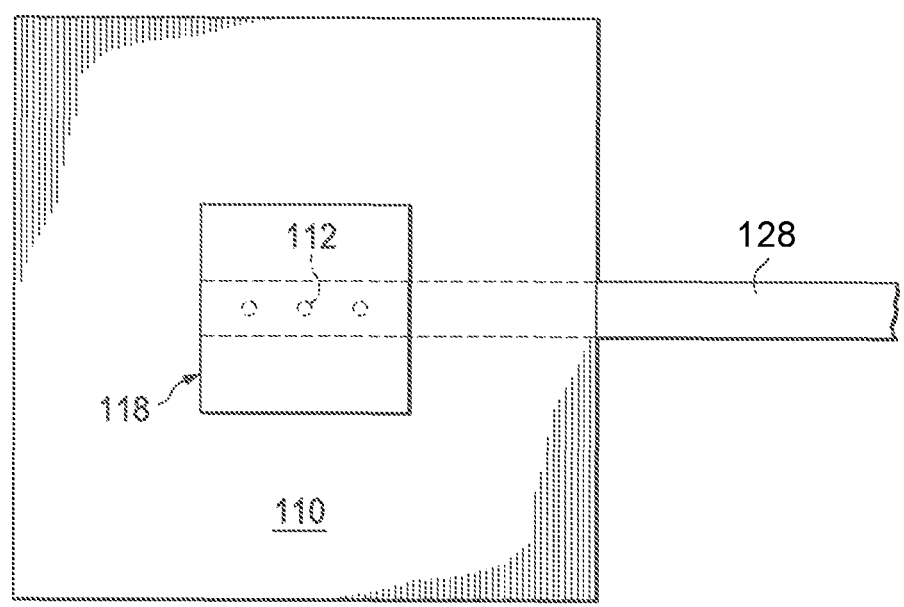

To transmit heat away from the plurality of dies 119, the first heat pipe 128 may extend through the metal lids 122. For convenience, the metal lids 122 may comprise gaps through which the first heat pipe 128 may be positioned, and the first heat pipe 128 may be secured on the substrate 110 with, e.g., the sealant 132 (as discussed above with respect to FIGS. 1A-1B).

In an alternative embodiment, the metal lids 122 may not be utilized, making an additional degree of freedom available for the positioning of the first heat pipe 128. Additionally, in an embodiment in which the first heat pipe 128 is bended into a ring shape, a heat spreader may be attached to the top of the first heat pipe 128 instead of the metal lids 122. Such an attachment may allow for a more efficient removal of heat through the first heat pipe 128. This embodiment also provides an additional mechanical enforcement to the package.

Figure 3A:
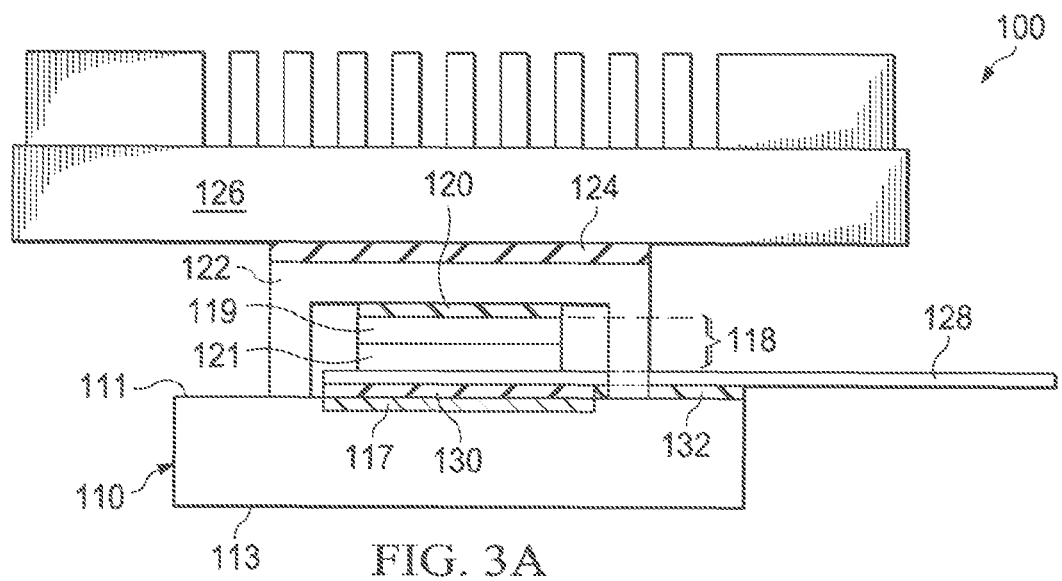
FIGS. 3A and 3B are a cross-sectional view and a top view, respectively, of package components with a heat pipe on a top of the substrate about or near stacked dies in accordance with an embodiment.
Figure 3B:
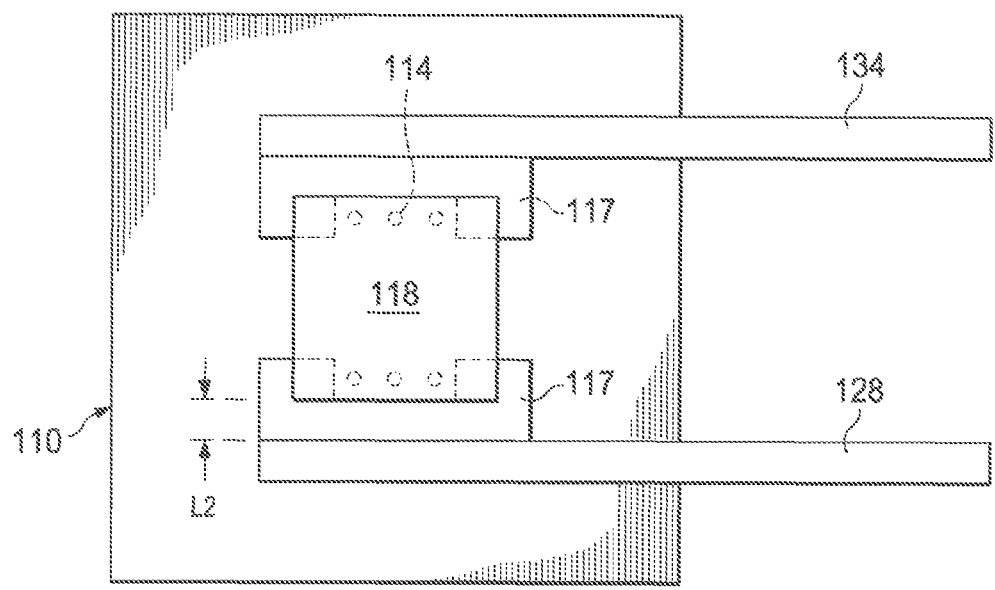

FIGS. 3A and 3B depict another embodiment of the package 100 similar to the embodiment described above with respect to FIGS. 2A-2B. In this embodiment, the first heat pipe 128 may be utilized in conjunction with a second heat pipe 134 in order to transfer heat wherever there are localized hot spots with respect to the bottom die 121. For example, the first heat pipe 128 and the second heat pipe 134 may be placed in thermal connection with the thermally conductive material 111 utilizing, e.g., the TIM 130. In an embodiment the first heat pipe 128 and the second heat pipe 134 may each be placed at a distance L2 of between about 0.5 mm and about 3.5 mm, such as about 3 mm, away from an adjacent edge of the plurality of dies 118, although any suitable distance may alternatively be utilized.

During the operation of a three-dimensional integrated circuit, as illustrated by the various embodiments discussed previously, the heat that would normally accumulate at the interface between the bottom die 121 and the substrate 110 may be carried away by the heat pipes 128 in simultaneous conjunction with the heat sink 126 that removes the heat of the top die 119. This combination may achieve a significant increase in the cooling ability of the package 100 since the heat pipes 128 introduce extra and efficient pathways to transfer thermal energy away from the heat sources. The heat pipes 128 may provide easy implementation and flexibility in adopting various configurations to accommodate local hot spot regions in the bottom die 121. Heat pipes 128 may also eliminate the potential for requiring a highly-efficient heat sink, which may be very expensive. Accordingly, the embodiments may be used for dies generating a great amount of heat, such as multi-core processors or the Hybrid Memory Cube (HMC).

By utilizing the heat pipes 128 along with the substrate 110, heat transfer may be induced through the substrate 110 along with other forms of heat transfer such as through the metal lids 122. Such a removal of heat through the substrate 110 and the heat pipes 128 helps to alleviate heat buildup that can occur adjacent to the substrate 110, and helps to reduce the amount of heat that can build up in multiple-chip stacks. This makes heat dissipation, and overall device performance, more efficient and less likely to deteriorate or malfunction.

In accordance with an embodiment, a semiconductor device comprising a substrate with a first surface and a second surface is provided. A first semiconductor die has a first side and a second side, wherein the first side is bonded to the first surface of the substrate, and a first heat pipe is in thermal connection to the first side of the first semiconductor die.

In accordance with another embodiment, a semiconductor device comprising a substrate with a first surface and a second surface is provided. A first semiconductor die comprises a first surface bonded to the first surface of the substrate, and a first heat pipe is located adjacent to the first surface of the first die and in thermal connection with the first surface of the first semiconductor die.

In accordance with yet another embodiment, a semiconductor package comprising a substrate with a first surface and a second surface is provided. A first thermal via extends through the substrate from the first surface to the second surface, and a first semiconductor die is bonded to the first surface of the substrate, the first semiconductor die having a first surface facing the first surface of the substrate and in thermal connection with the first thermal via. A heat pipe is located adjacent the second surface of the substrate and in thermal connection with the first thermal via.

In accordance with yet another embodiment, a semiconductor device is provided. The semiconductor device comprises a substrate with a first surface and a second surface, a first semiconductor die bonded to the first surface of the substrate, and a first heat pipe on the first surface of the substrate and in thermal connection with the first semiconductor die.

In accordance with yet another embodiment, a semiconductor device is provided. The semiconductor device comprises a substrate with a first surface and a second surface opposite from the first surface, a die stack of one or more semiconductor dies, the die stack having a first side and a second side, wherein the first side is bonded to the first surface of the substrate, and a first heat pipe adhered to the first surface of the substrate. A sealant couples the first heat pipe to the first surface of the substrate, the sealant having a lower thermal conductivity than the first heat pipe. The semiconductor device further comprises a metal lid over the second side of the die stack, the metal lid having sidewalls extending to the substrate.

In accordance with yet another embodiment, a semiconductor device is provided. The semiconductor device comprises a substrate with a first surface and a second surface opposite from the first surface, a die stack coupled to the first surface of the substrate, the die stack comprising one or more semiconductor dies, and a first heat pipe and a second heat pipe adhered to the first surface of the substrate via a sealant, the sealant having a lower thermal conductivity than the first heat pipe and the second heat pipe.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a substrate with a first surface and a second surface;
   a first semiconductor die bonded to the first surface of the substrate;
   a first heat pipe on the first surface of the substrate and in thermal connection with the first semiconductor die; and
   a thermally conductive layer in the substrate, the first semiconductor die being on at least a portion of the thermally conductive layer such that the thermally conductive layer is interposed between the first semiconductor die and the substrate, wherein the thermally conductive layer extends from the first semiconductor die to the first heat pipe, wherein the first semiconductor die is thermally connected to the thermally conductive layer using dummy solder balls.

2. The semiconductor device of claim 1, further comprising a second semiconductor die bonded to the first semiconductor die, the first semiconductor die being interposed between the second semiconductor die and the substrate.

3. The semiconductor device of claim 1, wherein the thermally conductive layer comprises copper.

4. The semiconductor device of claim 1, wherein the first heat pipe further comprises a solid-filled, planar material of high thermal conductivity.

5. The semiconductor device of claim 1, further comprising a second heat pipe on the first surface of the substrate and in thermal connection with the first semiconductor die.

6. The semiconductor device of claim 1, further comprising a thermally conductive lid, the first semiconductor die being interposed between the thermally conductive lid and the substrate.

7. The semiconductor device of claim 6, wherein the thermally conductive lid is thermally bonded to the thermally conductive layer.

8. The semiconductor device of claim 6, further comprising a heat sink attached to a side of the thermally conductive lid opposite the first semiconductor die using an adhesive.

9. A semiconductor device comprising:
   a substrate with a first surface and a second surface opposite from the first surface;
   a die stack of one or more semiconductor dies, the die stack having a first side and a second side, wherein a first die of the die stack being flip-chip bonded to the first surface of the substrate using solder balls;
   a first heat pipe adhered to the first surface of the substrate;
   a sealant coupling the first heat pipe to the first surface of the substrate, the sealant having a lower thermal conductivity than the first heat pipe; and
   a metal lid over the second side of the die stack, the metal lid having sidewalls extending to the substrate, wherein the metal lid does not completely overlap the first heat pipe in a plan view.

10. The semiconductor device of claim 9, wherein the substrate comprises a recess, and further comprising a thermally conductive layer within the recess, the die stack being thermally attached to the thermally conductive layer.

11. The semiconductor device of claim 10, wherein the die stack is thermally attached to the thermally conductive layer using dummy solder balls.

12. The semiconductor device of claim 10, wherein the recess has a depth of about 2.5 cm to about 4 cm.

13. The semiconductor device of claim 9, further comprising a second heat pipe, the die stack being interposed between the first heat pipe and the second heat pipe.

14. The semiconductor device of claim 9, further comprising a heat sink thermally connected to the metal lid, the metal lid being interposed between the die stack and the heat sink.

15. A semiconductor device comprising:
   a substrate with a first surface and a second surface opposite from the first surface;
   a die stack coupled to the first surface of the substrate, the die stack comprising one or more semiconductor dies; and
   a first heat pipe and a second heat pipe adhered to the first surface of the substrate via a sealant interposed between the substrate and the first heat pipe and interposed between the substrate and the second heat pipe, the sealant having a lower thermal conductivity than the first heat pipe and the second heat pipe.

16. The semiconductor device of claim 15, further comprising a metal lid over the die stack, the metal lid having sidewalls extending to the substrate.

17. The semiconductor device of claim 16, further comprising a heat sink thermally coupled to the metal lid, the metal lid being interposed between the die stack and the heat sink.

18. The semiconductor device of claim 15, wherein the first heat pipe comprises a thermally conductive tube filled with a fluid.

19. The semiconductor device of claim 15, further comprising a recess in the substrate and a thermally conductive layer in the recess, wherein the die stack is thermally coupled to the thermally conductive layer.

20. The semiconductor device of claim 19, wherein the die stack is thermally coupled to the thermally conductive layer using solder balls.

\* \* \* \* \*